United States Patent [19]

Hinooka

[11] Patent Number: 5,045,915
[45] Date of Patent: Sep. 3, 1991

[54] SEMICONDUCTOR INTEGRATED CIRCUIT DEVICE

[75] Inventor: Kiyonobu Hinooka, Tokyo, Japan

[73] Assignee: NEC Corporation, Tokyo, Japan

[21] Appl. No.: 439,856

[22] Filed: Nov. 21, 1989

[30] Foreign Application Priority Data

Nov. 21, 1988 [JP] Japan .................. 63-295009

[51] Int. Cl.⁵ ............ H01L 23/48; H01L 29/46; H01L 29/54; H01L 29/62
[52] U.S. Cl. .................. 357/71; 357/53; 357/68; 357/84
[58] Field of Search ............. 357/71, 53, 84, 68

[56] References Cited

U.S. PATENT DOCUMENTS

| 4,035,829 | 7/1977 | Ipri et al. ............... 357/49 |
| 4,679,171 | 7/1987 | Logwood et al. ........ 365/154 |
| 4,757,362 | 7/1988 | Biwa et al. ............. 357/23.8 |
| 4,814,849 | 3/1989 | Schrenk ................ 357/74 |

Primary Examiner—Rolf Hille
Assistant Examiner—David Ostrowski
Attorney, Agent, or Firm—Helfgott and Karas

[57] ABSTRACT

An improved semiconductor integrated circuit device wherein a wiring connected with a constant potential point is arranged at least at the upper part between two wirings which are proximately arranged in parallel.

1 Claim, 2 Drawing Sheets

SEMICONDUCTOR INTEGRATED CIRCUIT DEVICE

BACKGROUND OF THE INVENTION

1. Field of the Invention

This invention relates to a layout of a semiconductor integrated circuit using a capacitor, particularly to reduction of parasitic capacitance due to leader wirings from the capacitor.

2. Description of the Prior Art

In a capacitor for use in a switched capacitor circuit (hereinafter referred to as a SC circuit) and the like which are widely used in an analog LSI, an analog-digital mixed loading LSI or the like, a high specific accuracy in capacitance ratio is required. This is for the reason that, for example, in a circuit gain of the SC circuit is set by the ratio of capacitance to capacitance. In designing such capacitor, it is considered that the specific accuracy is ensured by generally using unit capacitors each having a unit capacitance $C_o$ and, for example, in the case that the capacitance of three times the unit capacitor $C_o$ is necessary, connecting the three unit capacitor $C_o$ in parallel. In this case, the layout is as shown, for example, in FIG. 1. Namely, lower electrodes 10 and 11 are formed on a semiconductor wafer substrate through an insulating film, upper electrodes 12-15 having a unit area are formed thereon through a dielectric film, the lower electrodes 11 and 10 are connected with aluminum wirings 6 and 16, respectively, the upper electrode 12 is connected with aluminum wiring 5 and furthermore the upper electrodes 13-15 are connected with aluminum wiring 17.

In case of the capacitor in which such specific accuracy is required, generally both of the upper electrodes 12-15 and the lower electrodes 10 and 11 are mostly formed with polycrystal silicon. This is for the reason that a bias dependency of the capacitance is lost by forming the upper and lower electrodes 10-15 with the same material. The upper electrodes 12-15 and the lower electrodes 10 and 11 are connected with the required circuit through the leader wirings 5, 6, 16 and 17 which were made from a wiring material such as aluminum or the like. In the portion in which the wiring material such as aluminum or the like is densely laid out, the leader wirings 5 and 17 from the upper electrodes 12 and 13-15, respectively, and the leader wirings 16 and 6 from the lower electrodes 10 and 11, respectively, are proximately arranged in many cases as in a region A of FIG. 1. FIG. 2 shows a sectional view taken along the face B—B' of the region A. As shown in FIG. 2, the leader wirings 5 and 6 of aluminum are formed above the semiconductor substrate 1 through a silicon oxide film 2 and an interlayer insulating film 3, and further an interlayer insulating film 4 and a covering film 8 are formed thereon. In this case, the line of electric force spreads out as shown in FIG. 2 and the capacitance between the wirings increases by about 1.5 times the capacitance as calculated supporting that the wiring materials 5 and 6 are in the form of plane parallel plates.

In the case that the leader wirings were proximately arranged as mentioned above, there was a defect that the parasitic capacitance between the wirings is added to the unit capacitance $C_o$ and thus the specific accuracy of capacitance or capacitance ratio becomes worse. Of course, if the leader wirings are not laid in close proximity to each other, the above problem is not serious. In this case, however, the layout is remarkably restricted and the layout area increases.

SUMMARY OF THE INVENTION

It is an object of the invention to provide an improved semiconductor integrated circuit device wherein the parasitic capacitance between the leader wirings is reduced and thus the capacitance accuracy is improved.

It is an another object of the invention to provide the SC circuit having the required properties.

The above object is accomplished by providing a semiconductor integrated circuit device wherein a wiring connected with a low impedance point is arranged at least at the upper part between the two wirings which are proximately arranged in parallel in the same layer.

BRIEF DESCRIPTION OF THE DRAWINGS

By way of example of the many features and advantages of the invention, an illustrative embodiment in the semiconductor integrated circuit device is described below and shown in the accompanying drawings, in which.

DETAILED DESCRIPTION OF THE PREFERRED EMBODIMENTS

Next, this invention will be described with reference to the accompanying drawings.

Figure 1:
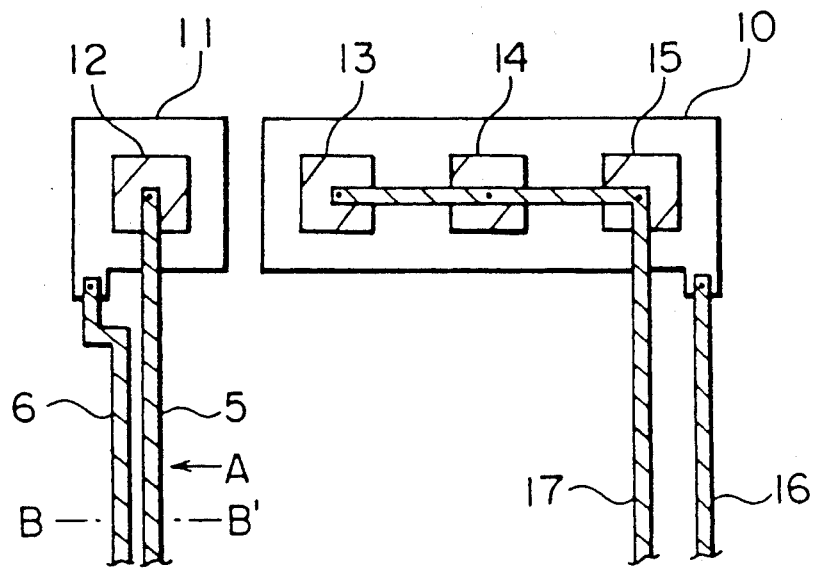
FIG. 1 shows a plane view of a capacitor part in the prior art.
Figure 2:
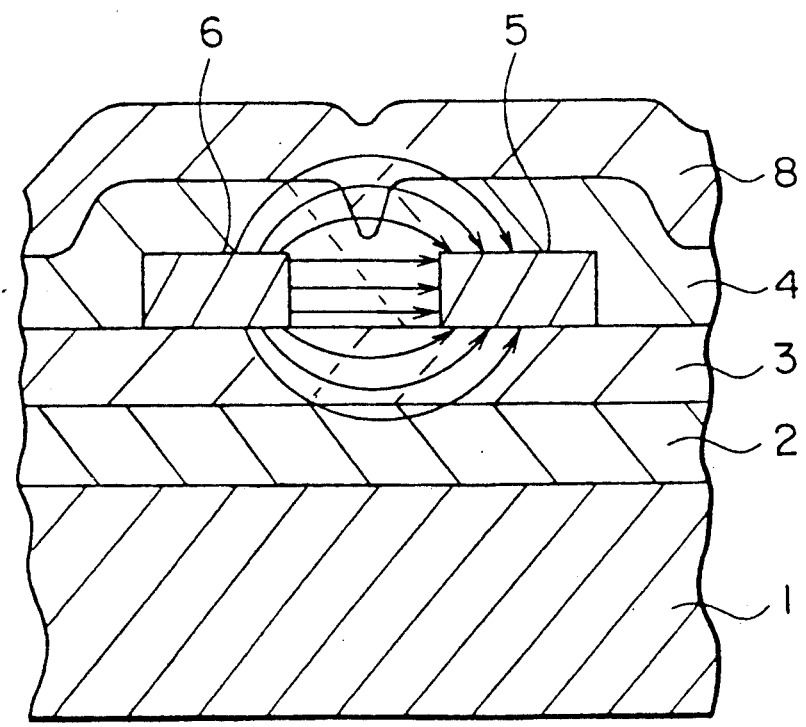
FIG. 2 shows a sectional view of a leader wiring part in the prior art.
Figure 3:
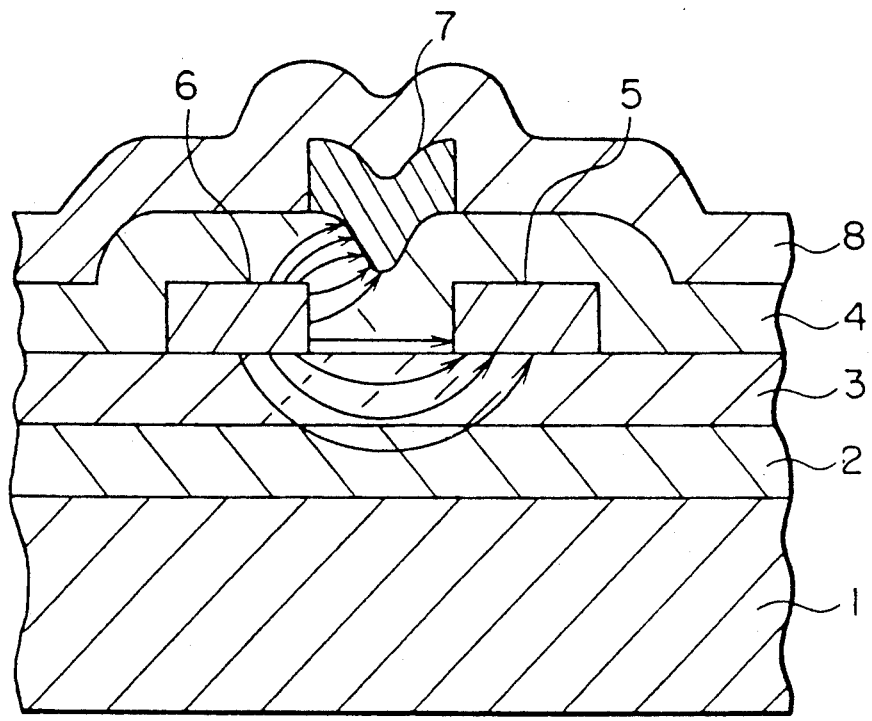
FIG. 3 shows a sectional view of one embodiment of this invention.

In FIG. 3, there is shown a sectional view of one embodiment according to this invention. The description is now made with regard to the case that, in the two layer process of aluminum, an aluminum wiring of the first layer is used as a leader wiring.

In this case, the second layer wiring 7 of aluminum or the like is arranged so that it covers the upper part between the first layer wirings 5 and 6 of aluminum or the like. Also, this wiring 7 is connected with a constant voltage point through a low impedance (preferably a grounding potential point). Therefore, the line of electric force is curved in the direction of the wiring 7 as shown in FIG. 3 and thus the capacitance between the wirings 5 and 6 is reduced. Our simulation shows that the capacitance, when the wiring 7 is grounded, is not more than $\frac{1}{3}$ of that in the prior art without using the wiring 7. Therefore, the specific accuracy of capacitance connected to the wirings 5 and 6 or the capacitance ratio between the capacitors having lead wires formed in accordance with the embodiment shown in FIG. 3 is improved. In addition, the layout area does not increase by arranging the wiring 7 at the upper part in three-dimentions. In this case, of course, the capacitance to the ground potential increases, but in the SC circuit it is possible to construct a circuit on which the capacitance to the ground potential has no effect.

Figure 4:
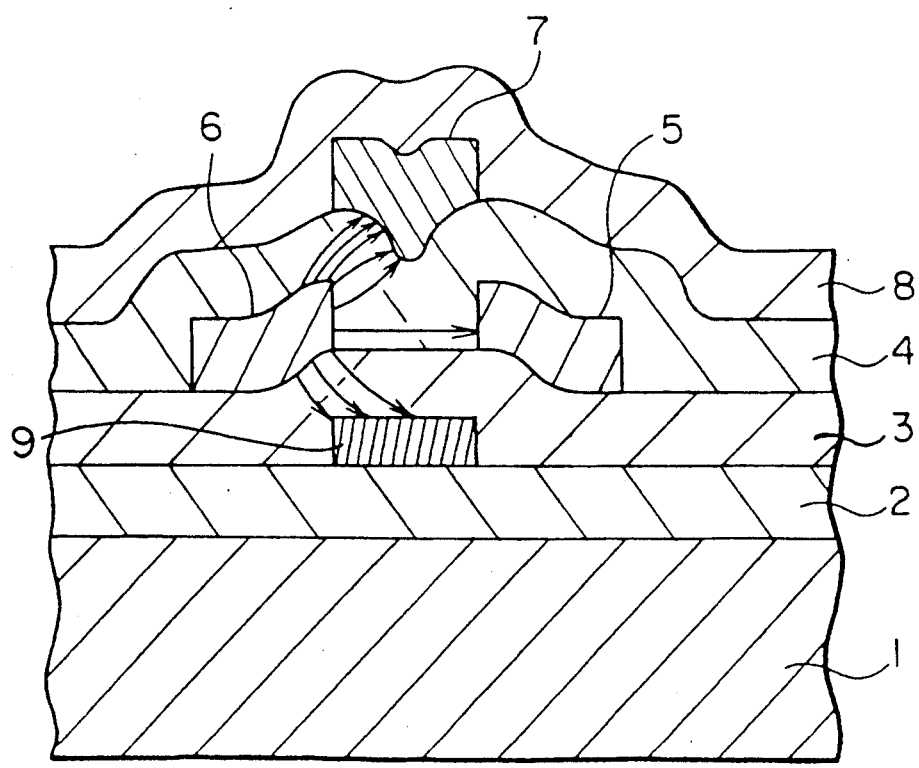
FIG. 4 shows a sectional view of another embodiment of this invention.

In FIG. 4, there is shown a sectional view of an another embodiment according to this invention. Though, the embodiment of FIG. 3 forms only the wiring 7 connected to the constant voltage point at the upper part between the proximate wirings 5 and 6, in this embodiment, another wiring 9 connected to the constant voltage is formed further at the lower part between the wirings 5 and 6. It is sufficient to form this wiring with a wiring material, such as a polycrystal silicon or the like, which can be ordinarily used.

In the case that the wiring 9 was arranged as mentioned above, the same effect as in the above embodiment is attained only at the lower part between the wirings 5 and 6, and the capacitance between the wirings 5 and 6 becomes much smaller.

From the foregoing it will be appreciated that with the semiconductor integrated circuit device wherein the wiring connected to the constant voltage point is arranged at the upper part between the proximate wirings or at the upper and lower parts therebetween as described herein, the parasitic capacitance between the leader wirings of the capacitor is reduced and thus the specific accuracy of capacitance and the capacitance ratio between the capacitor is improved, and it becomes possible to obtain the SC circuit having the required properties.

What is claimed is:

1. A semiconductor integrated circuit device comprising a semiconductor wafer substrate, a first insulating film formed on said semiconductor wafer substrate, two wirings formed proximately and in parallel with each other on said first insulating film, a second insulating film formed over said two wirings, a first constant voltage wiring for constant voltage and formed on said second insulating film, said first constant voltage wiring being formed of aluminum material and being positioned above said two wirings and extending over a space therebetween, and a second constant voltage wiring for constant voltage and formed in said first insulating film, said second constant voltage wiring being formed of polycrystal silicon and being positioned below said two wirings and extending under a space therebetween.

* * * * *